United States Patent [19]
Hayano et al.

[11] Patent Number: 5,930,190
[45] Date of Patent: Jul. 27, 1999

[54] SINGLE-CHIP MEMORY SYSTEM AND METHOD FOR OPERATING THE SAME

[75] Inventors: Kiminori Hayano, Tokyo; Yasuhiro Maeda, Kanagawa, both of Japan

[73] Assignee: NEC Corporation, Tokyo, Japan

[21] Appl. No.: 08/956,369

[22] Filed: Oct. 23, 1997

[30] Foreign Application Priority Data

Oct. 29, 1996 [JP] Japan ................................. 8-286607

[51] Int. Cl.⁶ ................................................ G11C 7/00
[52] U.S. Cl. .................................... 365/205; 365/190
[58] Field of Search .............................. 365/149, 205, 365/207, 208, 190

[56] References Cited

U.S. PATENT DOCUMENTS

| | | | |
|---|---|---|---|
| 5,274,585 | 12/1993 | Suyama | 365/149 |
| 5,313,426 | 5/1994 | Sakuma | 365/205 |
| 5,566,116 | 10/1996 | Kang | 365/205 |
| 5,701,268 | 12/1997 | Lee | 365/205 |

Primary Examiner—Son Mai
Attorney, Agent, or Firm—McGinn & Gibb, P.C.

[57] ABSTRACT

To fabricate a smaller memory system, a memory system includes a memory cell array having a first memory cell and a second memory cell, a first switching circuit connected to the first memory cell, a second switching circuit connected to the second memory cell, and a sense amplifier connected to the first and second switching circuits. The sense amplifier includes an N-type flip-flop circuit for selectively amplifying data from the first memory cell or the second memory cell, a P-type flip-flop circuit for selectively amplifying the data from the first memory cell or the second memory cell, and a first circuit formed between the N-type flip-flop circuit and the P-type flip-flop circuit. When data in the first memory cell is to be transferred, the first switching circuit is activated and the data from the first memory cell is transferred to the sense amplifier, and then the data is amplified by the sense amplifier. When data in the second memory cell is to be transferred, the second switching circuit is activated and the data from the second memory cell is transferred to the sense amplifier, and then the data is amplified by the sense amplifier.

6 Claims, 7 Drawing Sheets

SINGLE-CHIP MEMORY SYSTEM AND METHOD FOR OPERATING THE SAME

BACKGROUND OF THE INVENTION

The present invention generally relates to a single-chip memory system, and more particularly to a memory system for achieving high integration.

DESCRIPTION OF THE RELATED ART

With recent technological advancements in fabricating a single-chip semiconductor dynamic random access memory (DRAM) system, DRAM systems have become highly integrated, and a chip size of the DRAM system has become smaller.

Specifically, a so-called "shared sense amplifier" technique is one of the effective methods for fabricating a highly integrated, single-chip semiconductor DRAM system. This technique is explained, for example, in Japanese Patent Application Laid-Open No. 5-62462, Japanese Patent Application Laid-Open No. 6-139774, ISSCC DIGEST OF TECHNICAL PAPERS (e.g., pp. 246–247 and 248–249, February 1989), and SYMPOSIUM ON VLSI CIRCUITS (e.g., pp. 113–114, May 1989).

According to the shared sense amplifier method, each sense amplifier is connected to two memory cell arrays. Of course, in operation, each sense amplifier is connected selectively to only one memory cell array. That is, one sense amplifier is "shared" by two memory cell arrays, and is selectively connected to one of the memory cell arrays for reading-out data therefrom. Therefore, the chip-size of the DRAM system can be much smaller because the number of sense amplifiers is decreased to one-half the number of sense amplifiers of the conventional DRAM system.

Figure 1:
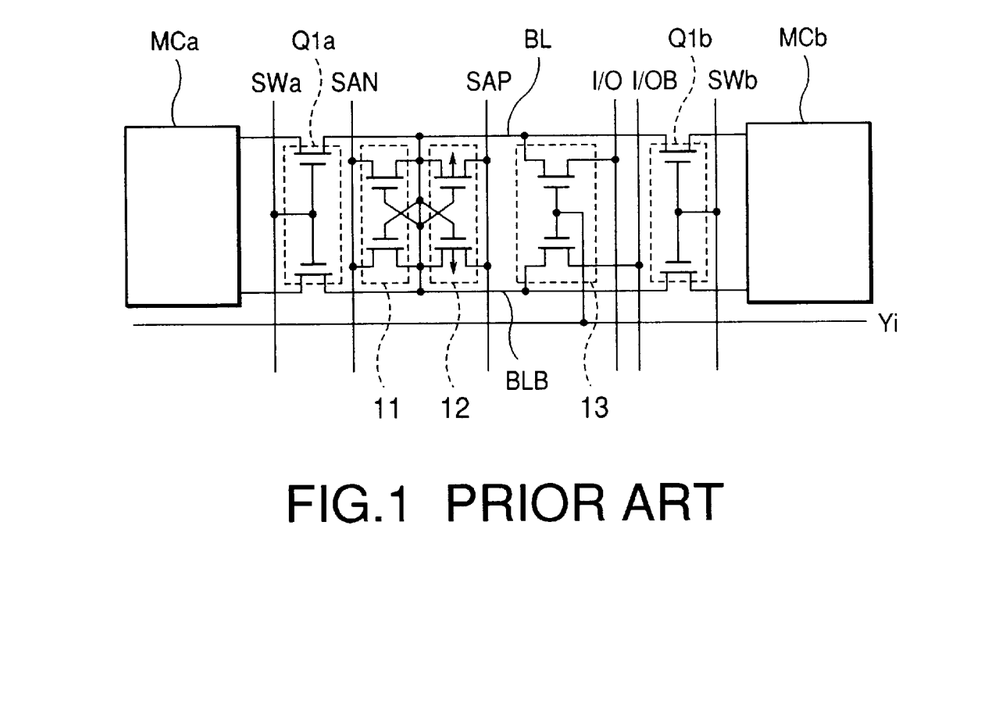
FIG. 1 is a circuit diagram of a shared sense amplifier of a conventional dynamic random access memory (DRAM) system.

FIG. 1 is a circuit diagram showing the shared sense amplifier disclosed in Japanese Patent Application Laid-Open No. 5-62462. In FIG. 1, the sense amplifier includes an N-type flip-flop circuit 11 having a pair of N-type metal oxide semiconductor (MOS) transistors and a P-type flip-flop circuit 12 having a pair of P-type MOS transistors.

Moreover, the sense amplifier is connected with a memory cell MCa in a first memory cell array and a memory cell MCb in a second memory cell array, through switching transistors Q1a and Q1b, respectively.

When the memory cell MCa is selected for reading data therefrom, the switching transistor Q1a is activated and turns ON, and the switching transistor Q1b is inactivated and turns OFF. Therefore, the data from the memory cell MCa is amplified by the N-type flip-flop circuit 11 and the P-type flip-flop circuit 12. Then, the amplified data is outputted to a pair of output lines I/O and I/OB through a column selector 13.

When the memory cell MCb is selected for reading data therefrom, the switching transistor Q1b is activated and turns ON, and the switching transistor Q1a is inactivated and turns OFF. Therefore, the data from the memory cell MCb is amplified by the N-type flip-flop circuit 11 and the P-type flip-flop circuit 12. Then, the amplified data is outputted to a pair of output lines I/O and I/OB through the column selector 13.

As mentioned above, the shared sense amplifier in FIG. 1 is connected to the memory cells MCa and MCb. Therefore, the chip-size of the DRAM system becomes smaller.

However, the shared sense amplifier in FIG. 1 has a problem. Specifically, if the N-type flip-flop circuit 11 and the P-type flip-flop circuit 12 are formed close together in the chip, "latch-up" of these circuits occurs. For purposes of this application, "latch-up" is defined as the circuits locking-up so as not to work properly.

For preventing latch-up in the DRAM system, generally, the N-type flip-flop circuit 11 must be formed about 5–10 $\mu$m away from the P-type flip-flop circuit 12. However, in practice, the distance should be about 10–20% more than the distance mentioned above, for operating the shared sense amplifier correctly and stably. Thus, the DRAM chip size becomes large due to the required separation of the N-type and P-type flip-flop circuits.

Figure 2:
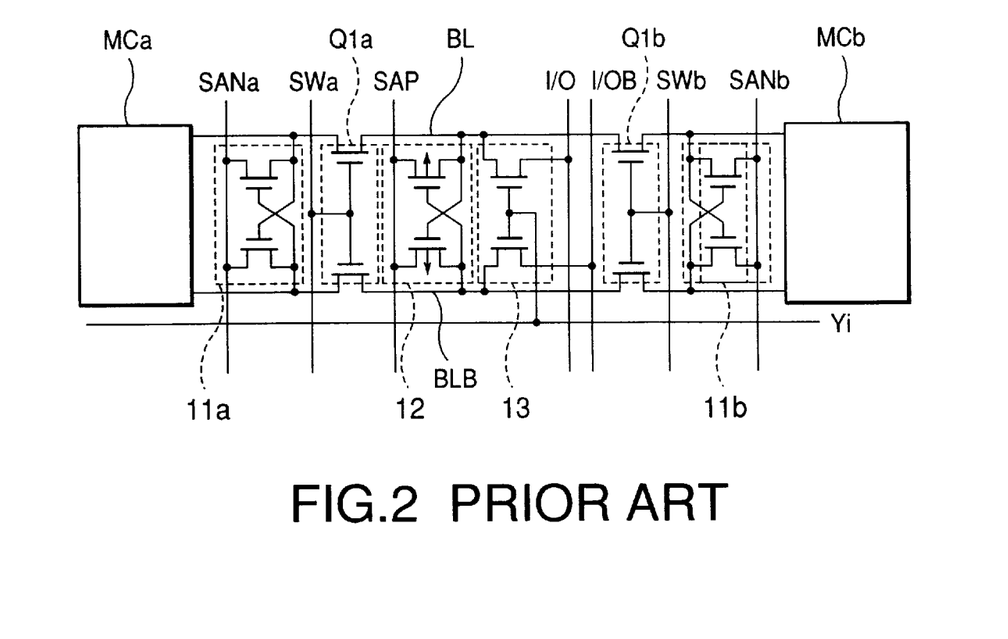
FIG. 2 is a circuit diagram of another shared sense amplifier of a conventional DRAM system.

FIG. 2 is a circuit diagram showing another shared sense amplifier disclosed in Japanese Patent Application Laid-Open No. 5-62462, which overcomes the above-mentioned drawback of the structure of FIG. 1 and which provides a two-stage amplification for faster amplification of data. In FIG. 2, the shared sense amplifier includes two N-type flip-flop circuits 11a and 11b. The same parts in FIG. 2 as those in FIG. 1 are numbered with the same reference numerals as in FIG. 1. For brevity, an explanation of these parts is omitted from the following description.

When the memory cell MCa is selected for reading data therefrom, first, the data is outputted to the N-type flip-flop circuit 11a. At this time, the switching transistor Q1a is inactivated and turns OFF. Therefore, a pair of bit lines BL and BLB is electrically disconnected from the N-type flip-flop circuit 11a. Then, the data is amplified to a predetermined voltage by the N-type flip-flop circuit 11a.

Thereafter, the switching transistor Q1a is activated and turns ON. Therefore, the pair of bit lines BL and BLB is electrically connected with the N-type flip-flop circuit 11a. Then, the data amplified by the N-type flip-flop circuit 11a is further amplified by the P-type flip-flop circuit 12.

Finally, the amplified data is outputted to the pair of output lines I/O and I/OB through the column selector 13.

The operation for the memory cell MCb is similar to the operation for the memory cell MCa. Therefore, for brevity, an explanation of the operation is omitted.

The shared sense amplifier in FIG. 2 amplifies data faster than the shared amplifier in FIG. 1, because parasitic capacitance is decreased by disconnecting the pair of bit lines BL and BLB from the N-type flip-flop circuit 11a.

Moreover, the latch-up of the shared sense amplifier in FIG. 2 is prevented, even if the P-type flip-flop circuit is formed relatively close to the N-type flip-flop circuit, because the switching transistor Q1a is formed between the P-type flip-flop circuit 12 and the N-type flip-flop circuit 11a, and the switching transistor Q1b is formed between the P-type flip-flop circuit 12 and the N-type flip-flop circuit 11b.

However, the shared sense amplifier in FIG. 2 becomes larger than the shared sense amplifier in FIG. 1, because the shared sense amplifier in FIG. 2 has two N-type flip-flop circuits 11a and 11b. This is a problem.

Thus, the conventional DRAM systems cannot achieve simultaneously high speed operation, high integration and prevention of latch-up in a smaller semiconductor chip.

SUMMARY OF THE INVENTION

In view of the foregoing problems of the conventional DRAM systems, it is an object of the present invention to provide an improved single-chip semiconductor DRAM system.

It is another object of the present invention to provide an improved method for operating the DRAM system.

In a first aspect, a memory system according to the present invention includes a memory cell array having a first memory cell and a second memory cell, a first switching circuit connected to the first memory cell, a second switching circuit connected to the second memory cell, and a sense amplifier connected to the first and second switching circuits, wherein the sense amplifier includes an N-type flip-flop circuit for selectively amplifying data from one of the first memory cell and the second memory cell, a P-type flip-flop circuit for selectively amplifying the data from one of the first memory cell and the second memory cell, and a first circuit formed between the N-type flip-flop circuit and the P-type flip-flop circuit, wherein the first switching circuit is activated and the data from the first memory cell is transferred to the sense amplifier, and the data is amplified by the sense amplifier when the first memory cell is selected, the second switching circuit is activated and the data from the second memory cell is transferred to the sense amplifier, and the data is amplified by the sense amplifier when the second memory cell is selected.

With the unique and unobvious structure of the present invention, the first circuit is formed between the N-type flip-flop circuit and the P-type flip-flop circuit. Therefore, latch-up is prevented when the single chip memory system is fabricated with high integration. Further, with the present invention, a number of the circuits is the same as the conventional system shown in FIG. 1. Therefore, the single chip memory system may be made smaller than the conventional systems.

BRIEF DESCRIPTION OF THE DRAWINGS

The foregoing and other objects, aspects and advantages will be better understood from the following detailed description of preferred embodiments of the invention with reference to the drawings, in which.

DETAILED DESCRIPTION OF PREFERRED EMBODIMENTS OF THE INVENTION

Referring now to the drawings, and more particularly to FIGS. 3–5(B), a single-chip semiconductor dynamic random access (DRAM) memory system 101 is described according to a first embodiment of the present invention.

Figure 3:
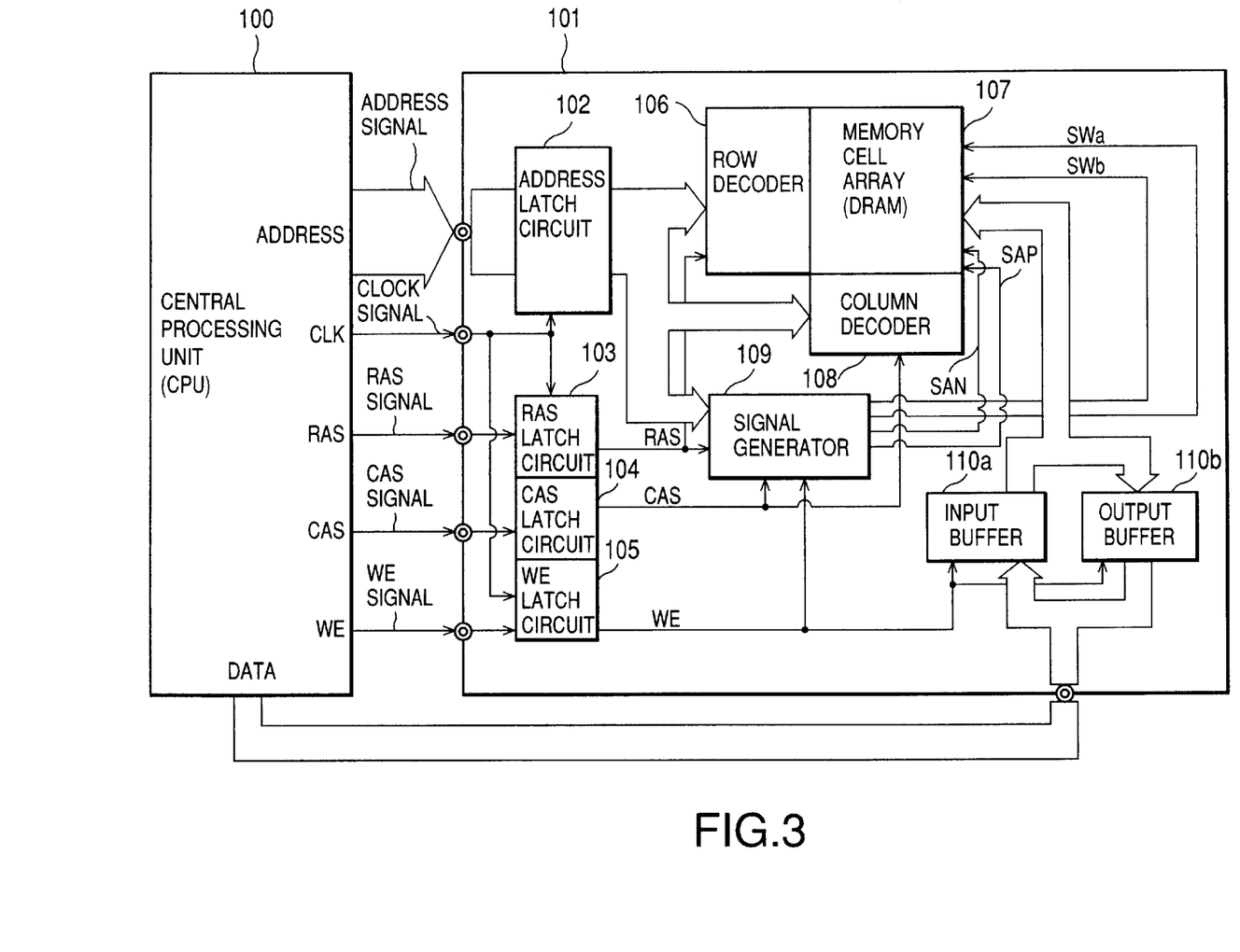
FIG. 3 is a diagram of a single-chip semiconductor DRAM system and an external central processing unit (CPU) according to the present invention.

In the first embodiment, the DRAM system 101 includes an address latch circuit 102, an RAS latch circuit 103 for latching a row address strobe (RAS) signal, a CAS latch circuit 104 for latching a column address strobe (CAS) signal, a WE latch circuit 105 for latching a write enable (WE) signal, a row decoder 106, a DRAM cell array 107 including a plurality of first DRAM cells, a plurality of second DRAM cells, and a plurality of shared sense amplifiers each connected to one of the first DRAM cells and one of the second DRAM cells, a column decoder 108, a signal generator 109, an input buffer 110a, and an output buffer 110b.

Further, the DRAM system 101 is connected to an external central processing unit (CPU) 100 for executing instructions.

The CPU 100 executes an instruction by using data from the DRAM system 101, and outputs a clock signal, the RAS signal, the CAS signal, the WE signal and an address signal.

When the CPU 100 changes the clock signal to an active level (e.g., "1") from an inactive level (e.g., "0"), the address latch circuit 102, the RAS latch circuit 103, the CAS latch circuit and the WE latch circuit, respectively, latch the address signal, the RAS signal, the CAS signal and the WE signal, and output the latched signals, respectively.

The row decoder 106 decodes the address signal when the RAS signal is changed to an active level (e.g., "0") from an inactive level (e.g., "1"), and activates (selects) a word line corresponding to the address signal.

The signal generator 109 changes a first switching signal SWa to an active level (e.g., "1") from an inactive level (e.g., "0"), when the address signal represents an address of one of the first DRAM cells, and the RAS signal is changed to an active level from an inactive level. The signal generator 109 changes a second switching signal SWb to an active level (e.g., "1") from an inactive level (e.g., "0"), when the address signal represents an address of one of the second DRAM cells, and the RAS signal is changed to an active level from an inactive level. The signal generator 109 changes the switching signal, which is changed to an active level, to an inactive level after a predetermined time has elapsed.

Then, the signal generator 109 changes a first activate signal SAN from an intermediate voltage (e.g., the voltage between a first voltage (e.g., 0 V) and a second voltage (e.g., Vcc)) to the first voltage, by using the RAS, CAS, and WE signals. Thereafter, the signal generator 109 changes a second activate signal SAP from the intermediate voltage to the second voltage, by using the RAS, CAS, and WE signals.

The column decoder 108 decodes the address signal, and changes a column selection signal Yi (e.g., wherein i is an integer greater than 1) to an active level (e.g., "1") from an inactive level (e.g., "0"), corresponding to the address signal, when the CPU 100 changes the CAS signal to an active level (e.g., "0") from an inactive level (e.g., "1").

The input buffer 110a is activated, and transmits data from the CPU 100 to the memory cell array 107, when the WE signal is changed to an active level (e.g., "1") from an inactive level (e.g., "0"). The input buffer 110a is not activated, and does not transmit the data from the CPU 100 to the memory cell array 107, when the WE signal is changed to an inactive level from an active level.

The output buffer 110b is activated, and transmits data from the memory cell array 107 to the CPU 100, when the WE signal is changed to an inactive level from an active level. The output buffer 110b is not activated, and does not transmit the data from the memory cell array 107 to the CPU 100, when the WE signal is changed to an active level from an inactive level.

Figure 4:
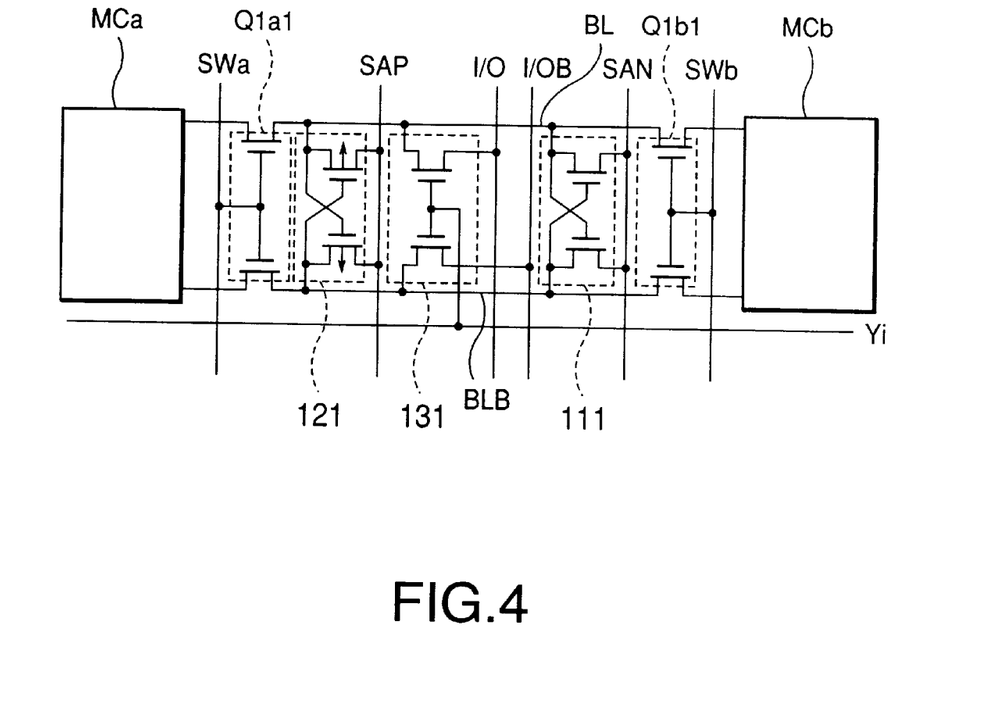
FIG. 4 is a circuit diagram of a shared sense amplifier according to a first embodiment of the present invention.

FIG. 4 shows a circuit diagram of the memory cell array 107. In FIG. 4, only one shared sense amplifier, a memory cell MCa of the first DRAM cells and a memory cell MCb of the second DRAM cells are shown for easy understanding, although in the circuit there are a plurality of shared sense amplifiers and a plurality of the first and second DRAM cells.

The shared sense amplifier, according to the present invention, has a first switching circuit Q1a1, a second switching circuit Q1b1, an N-type flip-flop circuit 111, a P-type flip-flop circuit 121, and a column selector 131 which is formed between the N-type flip-flop circuit 111 and the P-type flip-flop circuit 121.

The first switching circuit Q1a1 has a first N-type metal oxide semiconductor (MOS) transistor having a source-drain path between one of a pair of data lines of the first memory cell MCa and a bit line BL, and a second N-type MOS transistor having a gate connected to a gate of the first N-type MOS transistor, and a source-drain path between another of a pair of the data lines of the first memory cell MCa and a bit line BLB. The gates of the first and second N-type MOS transistors receive the first switching signal SWa.

The second switching circuit Q1b1 has a third N-type MOS transistor having a source-drain path between one of a pair of data lines of the second memory cell MCb and the bit line BL, and a fourth N-type MOS transistor having a gate connected to a gate of the third N-type MOS transistor, and a source-drain path between another of a pair of the data lines of the second memory cell MCb and the bit line BLB. The gates of the third and fourth N-type MOS transistors receive the second switching signal SWb.

The N-type flip-flop circuit 111 has a fifth N-type MOS transistor having a gate connected to the bit line BLB and a source-drain path between the bit line BL and a line for receiving the first activate signal SAN, and a sixth N-type MOS transistor having a gate connected to the bit line BL, and a source-drain path between the bit line BLB and the line for receiving the first activate signal SAN.

The P-type flip-flop circuit 121 has a first P-type MOS transistor having a gate connected to the bit line BLB and a source-drain path between the bit line BL and a line for receiving the second activate signal SAP, and a second P-type MOS transistor having a gate connected to the bit line BL, and a source-drain path between the bit line BLB and the line for receiving the second activate signal SAP.

The column selector 131 has a seventh N-type MOS transistor having a source-drain path between the bit line BL and an output line I/O connected to the input buffer 110a and the output buffer 110b, and an eighth N-type MOS transistor having a gate connected to a gate of the seventh N-type MOS transistor, and a source-drain path between the bit line BLB and an output line I/OB connected to the input buffer 110a and the output buffer 110b. The gates of the seventh and eighth N-type MOS transistors receive the column selection signal Yi.

When the memory cell MCa is selected for reading data therefrom, first, the first switching signal SWa is changed to an active level (e.g., "1") by the signal generator 109. At this time, the second switching signal SWb has an inactive level (e.g., "0"). Therefore, a pair of data of the memory cell MCa is transferred to the bit lines BL and BLB. After the data is transferred to the bit lines BL and BLB, the signal generator 109 changes the first switching signal SWa to an inactive level from an active level. Therefore, the bit lines BL and BLB are disconnected electrically from the memory cell MCa.

Then, the signal generator 109 changes the first activate signal SAN from the intermediate voltage to the first voltage (e.g., ground voltage). Therefore, the N-type flip-flop circuit 111 starts amplifying the data. At this time, the parasitic capacitance of a line on which the data is transferred is decreased, because the bit lines BL and BLB are disconnected from the memory cell MCa. Therefore, the N-type flip-flop circuit 111 can amplify the data faster.

After a predetermined time has passed (e.g., the time needed for the N-type flip-flop circuit 111 to amplify the data), the signal generator 109 changes the second activate signal SAP from the intermediate voltage to the second voltage (e.g., Vcc). Therefore, the P-type flip-flop circuit 121 starts amplifying the data.

Finally, after the data is amplified fully, the column decoder 108 changes the column selection signal Yi to an active level (e.g., "1") from an inactive level (e.g., "0"). Therefore, the amplified data is outputted to the pair of output lines I/O and I/OB through the column selector 131.

When the memory cell MCb is selected for reading data, first, the second switching signal SWb is changed to an active level (e.g., "1") by the signal generator 109. At this time, the first switching signal SWa has an inactive level (e.g., "0"). Therefore, a pair of data of the memory cell MCb is transferred to the bit lines BL and BLB. After the data is transferred to the bit lines BL and BLB, the signal generator 109 changes the second switching signal SWb to an inactive level from an active level. Therefore, the bit lines BL and BLB are electrically disconnected from the memory cell MCb.

Then, the signal generator 109 changes the first activate signal SAN from the intermediate voltage to the first voltage (e.g., ground voltage). Therefore, the N-type flip-flop circuit 111 starts amplifying the data. At this time, the parasitic capacitance of a line of which the data transferred is decreased, because the bit lines BL and BLB are disconnected from the memory cell MCb. Therefore, the N-type flip-flop circuit 111 can amplify the data faster.

After a predetermined time has passed (e.g., the time needed for the N-type flip-flop circuit 111 to amplify the data), the signal generator 109 changes the second activate signal SAP from the intermediate voltage to the second voltage (e.g., Vcc). Therefore, the P-type flip-flop circuit 121 starts amplifying the data.

Finally, after the data is amplified fully, the column decoder 108 changes the column selection signal Yi to an active level (e.g., "1") from an inactive level (e.g., "0"). Therefore, the amplified data is outputted to the pair of output lines I/O and I/OB through the column selector 131.

FIG. 5(A) is a top view and FIG. 5(B) is a sectional view of the device of FIG. 5(A) taken along the line V—V in FIG. 5(A), for explaining a device structure of the first embodiment.

In a P-type silicon substrate 1, there are an N-well region 2, N-type diffusion layers 3 as the sources and drains of the N-type MOS transistors or as contact regions, and P-type diffusion layers 4 as the sources and drains of the P-type MOS transistors, polysilicon layers 5, 5a and 5b, tungsten silicide layers 6, aluminum layers 7, and contact holes 8.

As shown in FIGS. 5(A) and 5(B), the P-type flip-flop circuit 121 is formed next to the first switching circuit Q1a1, the column selector 131 is formed next to the P-type flip-flop circuit 121, the N-type flip-flop circuit 111 is formed next to the column selector 131, and the second switching circuit Q1b1 is formed next to the N-type flip-flop circuit 111, in the X direction.

According to the present invention, a number of the MOS transistors in FIG. 4 is the same as that in FIG. 1 and is less than that of the structure in FIG. 2. Moreover, "latch-up" is prevented and the stability of the operation is improved, because the N-type flip-flop circuit 111 is not formed next to the P-type flip-flop circuit 121. Therefore, a concentration of impurities in the N-well region 2 does not affect an operation of the N-type flip-flop circuit 111.

Further, the shared sense amplifier in the first embodiment amplifies data at almost the same speed as the shared sense amplifier in FIG. 2, because the shared sense amplifier in the first embodiment starts amplifying data after the bit lines BL and BLB are disconnected from the memory cell.

Second Embodiment

Figure 5:
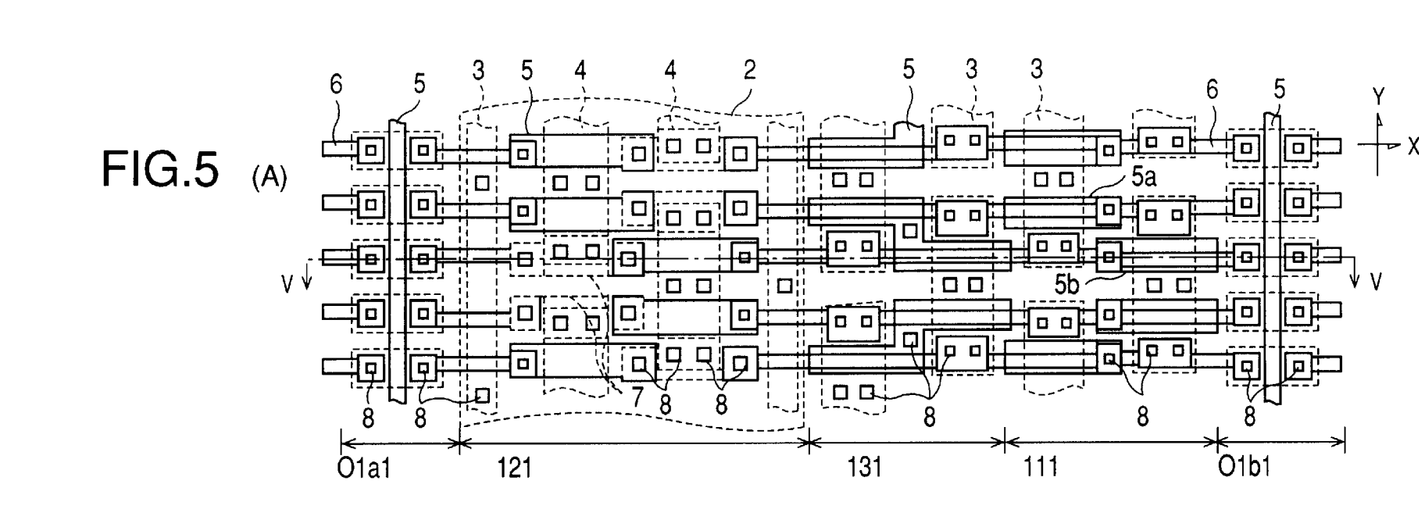
FIG. 5(A) shows a plan view of the shared sense amplifier shown in FIG. 4.
FIG. 5(B) shows a sectional view of the shared sense amplifier shown in FIG. 5(A) taken along lines V—V.
Figure 6:
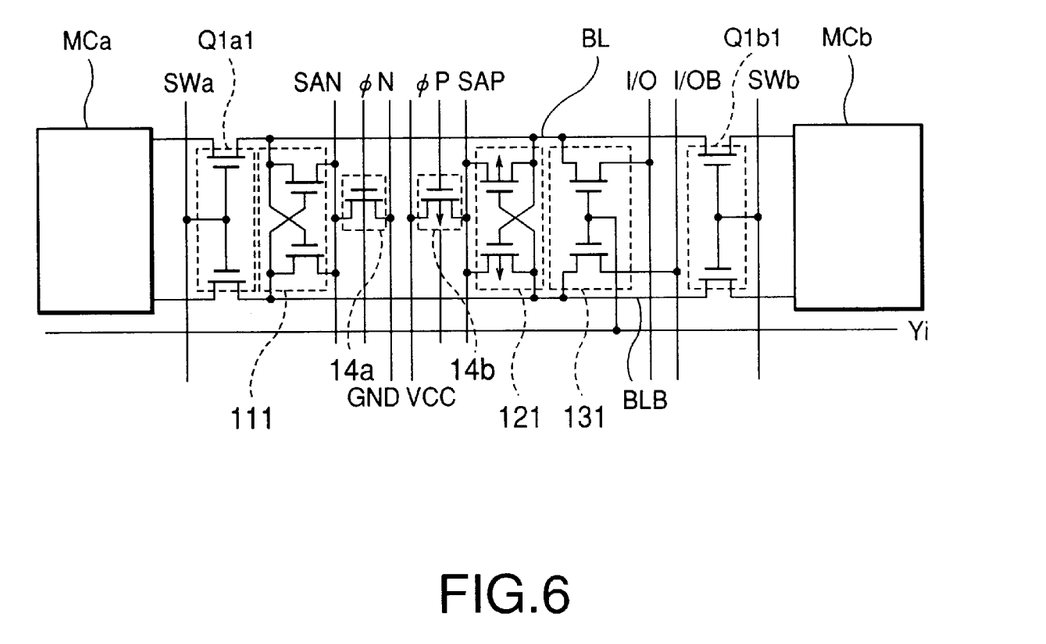
FIG. 6 is a circuit diagram of a shared sense amplifier according to a second embodiment of the present invention.
Figure 7:
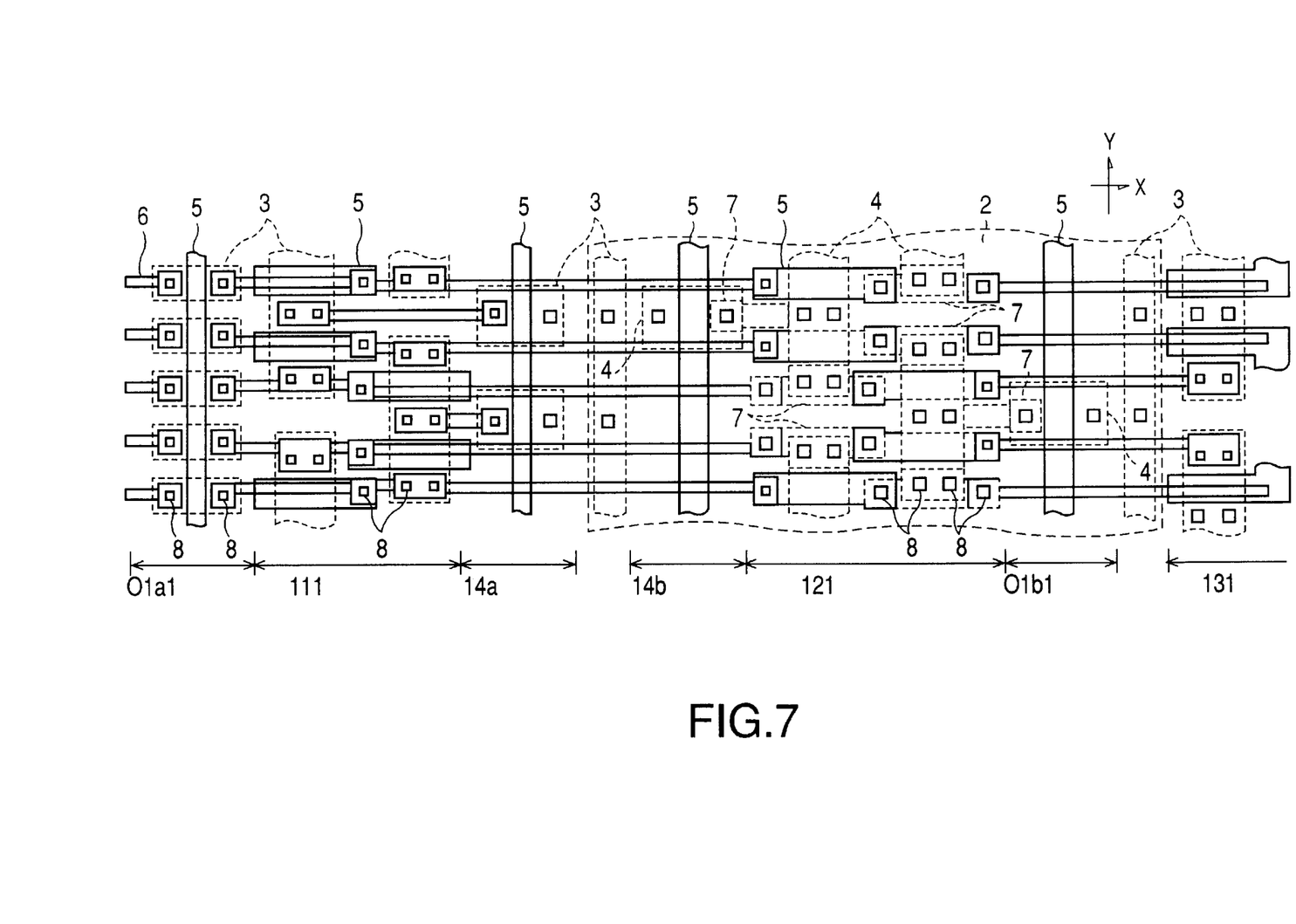
FIG. 7 shows a plan view of the shared sense amplifier shown in FIG. 6.

Referring now to the drawings, and more particularly to FIGS. 6 and 7, a shared sense amplifier is described according to a second embodiment of the present invention. The same parts in FIGS. 6 and 7 as those in FIGS. 4–5(B) are numbered with the same reference numerals as in FIGS. 4–5(B), and for brevity, an explanation of these parts is omitted.

In the second embodiment, a circuit is positioned between the N-type flip-flop circuit 111 and the P-type flip-flop circuit 121, instead of the column selector 131. In this arrangement, almost the same advantage as the first embodiment can be obtained, because the N-type flip-flop circuit 111 is not formed next to the P-type flip-flop circuit 121.

Specifically, the shared sense amplifier in the second embodiment further includes a ninth N-type MOS transistor 14a having a source-drain path between a ground line supplying a ground voltage and a line receiving the first activate signal SAN, and a third P-type MOS transistor 14b having a source-drain path between a line supplying the Vcc voltage and a line receiving the second activate signal SAP. A gate of the ninth N-type MOS transistor receives a signal ΦN, and a gate of the third P-type MOS transistor receives a signal ΦP.

In the second embodiment, the signal generator 109 changes the signal ΦN to an active level (e.g., "1") from an inactive level (e.g., "0") when the signal generator 109 changes the SAN signal to the first voltage. The signal generator 109 changes the signal ΦP to an active level (e.g., "0") from an inactive level (e.g., "1") when the signal generator 109 changes the SAP signal to the second voltage (not shown in the drawing).

According to the second embodiment, a width of the line receiving the SAN signal becomes substantially larger when the ninth N-type MOS transistor 14a turns "ON", although the width of the line receiving the SAN signal is the same as the width in the first embodiment. Similarly; a width of the line receiving the SAP signal becomes substantially larger when the third P-type MOS transistor 14b turns "ON", although the width of the line receiving the SAP signal is the same as the width in the first embodiment. Therefore, the shared sense amplifier in the second amplifier amplifies data faster than the first embodiment, even if a plurality of the shared sense amplifiers in the memory cell array 107 are operated and activated simultaneously.

FIG. 7 is a top view for explaining a device structure of the second embodiment.

As shown in FIG. 7, the N-type flip-flop circuit 111 is formed next to the first switching circuit Q1a1, the ninth N-type MOS transistor 14a and the third P-type MOS transistor 14b are formed next to the N-type flip-flop circuit 111, the P-type flip-flop circuit 121 is formed next to the ninth N-type MOS transistor 14a and the third P-type MOS transistor 14b, the second switching circuit Q1b1 is formed next to the P-type flip-flop circuit 121, and the column selector 131 is formed next to the second switching circuit Q1b1, in the X direction.

Figure 8:
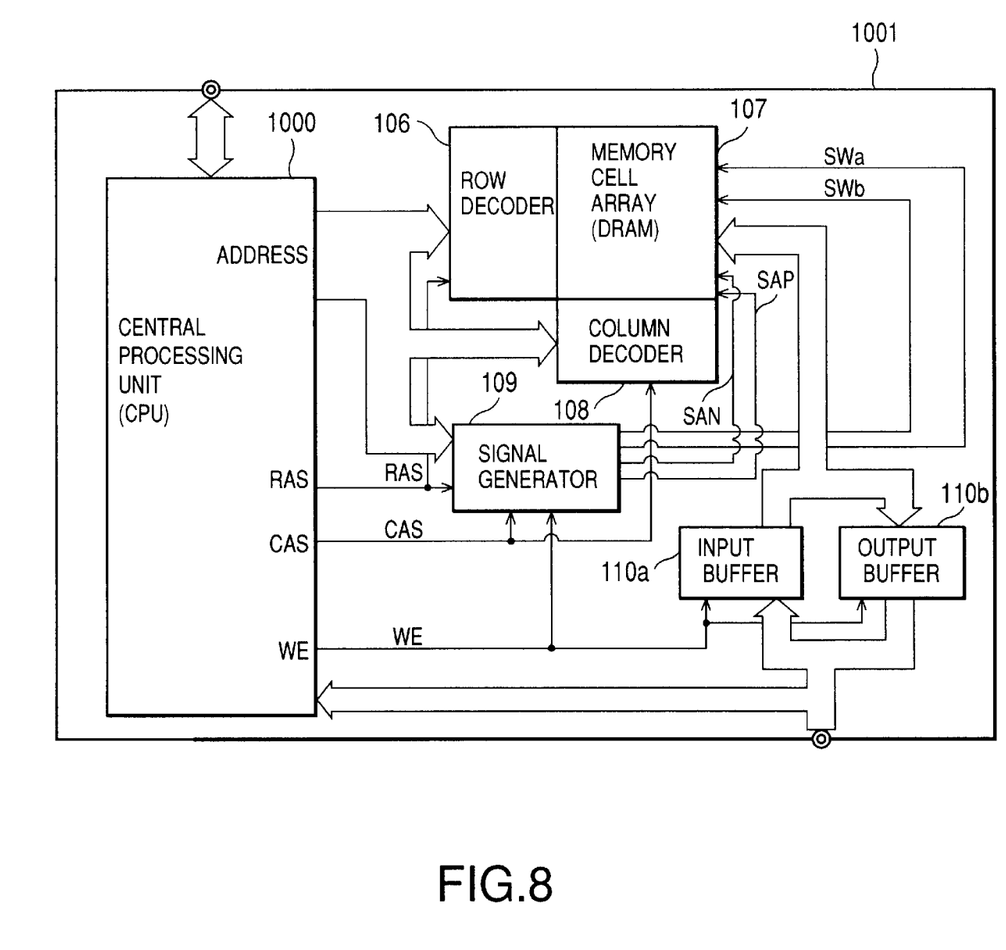
FIG. 8 is a diagram of a single-chip semiconductor DRAM system including an internal CPU according to the present invention.

FIG. 8 shows a single-chip semiconductor DRAM system 1001 including an internal CPU 1000. The internal CPU 1000 operates the same as the external CPU 100. The same parts in FIG. 8 as those in FIG. 3 are numbered with the same reference numerals as in FIG. 3, and for brevity, an explanation of these parts is omitted.

In these embodiments, as known by one of ordinary skill in the art taking the present specification as a whole, the type (e.g., N-type, P-type) of the MOS transistors can be changed suitably depending on the design of the DRAM system. Although the DRAM array 107 including a plurality of first DRAM cells, a plurality of second DRAM cells, and a plurality of shared sense amplifiers each connected to one of the first DRAM cells and one of the second DRAM cells, a plurality of shared sense amplifiers may be connected according to the present invention between a memory cell array containing the first memory cells and a memory cell array containing the second memory cells, respectively.

While the invention has been described in terms of several preferred embodiments, those skilled in the art will recognize that the invention can be practiced with modification within the spirit and scope of the appended claims.

Having thus described our invention, what we claim as new and desire to secure by Letters Patent is as follows:

1. A semiconductor device comprising:
    a first memory array;
    a second memory array;
    a data bus;
    a sense amplifier disposed between said first memory array and said second memory array;
    a first switching circuit disposed between said first memory array and said sense amplifier and electrically connecting said first memory array to said sense amplifier when said first memory array is selected;
    a second switching circuit disposed between said second memory array and said sense amplifier and electrically connecting said second memory array to said sense amplifier when said second memory array is selected; and
    a selector circuit including at least one first transistor of a first channel type which operatively couples said sense amplifier to said data bus,
    wherein said sense amplifier comprises a plurality of second transistors of said first channel type and a plurality of third transistors of a second opposite channel type, said third transistors being formed in a well region, said second transistors being disposed apart from said third transistors such that said first transistor in said selector circuit is disposed between said third transistors and said second transistors to make said well region distant from said second transistors.

2. The device as claimed in claim 1, wherein said first transistor is formed in a first area of a first conductivity type and said second transistors are formed in a second area of said first conductivity type, said well region being a second conductivity type, said first area intervening between said second area and said well region to separate said second area and said well region from each other.

3. The device as claimed in claim 2, wherein said second transistors and said third transistors are apart from each other enough to prevent an impurity contained in said well region from reaching said second area into which said second transistors are formed.

4. A semiconductor device comprising:
- a first memory array;
- a second memory array;
- a data bus;
- a sense amplifier disposed between said first memory array and said second memory array;
- a first switching circuit disposed between said first memory array and said sense amplifier and electrically connecting said first memory array to said sense amplifier when said first memory array is selected;
- a second switching circuit disposed between said second memory array and said sense amplifier and electrically connecting said second memory array to said sense amplifier when said second memory array is selected; and
- a selector circuit including at least one first transistor of a first channel type which operatively couples said sense amplifier to said data bus,
- wherein said sense amplifier comprises a plurality of second transistors of said first channel type and a plurality of third transistors of a second opposite channel type, said third transistors being formed in a well region, said second transistors being disposed apart from said third transistors by a separating circuit including at least one transistor of the first channel type and at least one transistor of the second channel type such that said separating circuit is disposed between said second transistors and said third transistors to make said well region distant from said second transistors.

5. The device as claimed in claim 4, wherein said well region is a first conductivity type and said second transistors are formed in an area of a second conductivity type, said separating circuit intervening between said area and said well region to separate said area and said well region from each other.

6. The device as claimed in claim 5, wherein said second transistors and said third transistors are apart from each other enough to prevent an impurity contained in said well region from reaching said area into which said second transistors are formed.

* * * * *